(12) United States Patent
Tanaka (10) Patent No.: US 9,941,460 B2
(45) Date of Patent: Apr. 10, 2018

(54) ELECTRONIC DEVICE (71) Applicant: SEIKO EPSON CORPORATION, Tokyo (JP)

(72) Inventor: Shuichi Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 215 days.

(21) Appl. No.: 15/056,130

(22) Filed: Feb. 29, 2016

(65) Prior Publication Data

US 2016/0276571 A1    Sep. 22, 2016

(30) Foreign Application Priority Data

Mar. 16, 2015    (JP) ................................. 2015-051589

(51) Int. Cl.
| | |
|---|---|
| *H01L 41/047* | (2006.01) |
| *B41J 2/14* | (2006.01) |
| *H05K 1/02* | (2006.01) |
| *H05K 1/11* | (2006.01) |

(52) U.S. Cl.
CPC ...... *H01L 41/0475* (2013.01); *B41J 2/14201* (2013.01); *H05K 1/0284* (2013.01); *H05K 1/11* (2013.01); *B41J 2002/14491* (2013.01); *B41J 2202/18* (2013.01); *H05K 2201/10083* (2013.01)

(58) Field of Classification Search
CPC ..... H01L 41/0475; H01L 41/053; H03H 9/15; H03H 9/17
USPC .................................................. 310/324, 348
See application file for complete search history.

(56) References Cited

U.S. PATENT DOCUMENTS

| | | | |
|---|---|---|---|
| 6,396,196 B1* | 5/2002 | Takeuchi | ................ B32B 18/00 310/324 |
| 7,495,373 B2* | 2/2009 | Sugahara | ............. B41J 2/14233 310/324 |
| 8,613,499 B2 | 12/2013 | Miyazawa | |

(Continued)

FOREIGN PATENT DOCUMENTS

| | | |
|---|---|---|
| EP | 1 645 417 | 4/2006 |
| EP | 1 750 304 | 2/2007 |
| JP | 2002-103602 A | 4/2002 |

(Continued)

OTHER PUBLICATIONS

European Search Report for Application No. 16157288.8 dated Nov. 29, 2016.

*Primary Examiner* — Derek Rosenau
(74) *Attorney, Agent, or Firm* — Workman Nydegger (57) ABSTRACT

An electronic device includes a sealing plate including a first surface connected to a pressure chamber formation substrate, and a second surface having a drive IC provided thereon. The sealing plate includes a first region in which a plurality of individual connection terminals are arranged, and a second region in a position different from the first region. A plurality of bump electrodes are arranged at a pitch different from a pitch of an individual connection terminals, in a region overlapping a second region, and a wiring group connecting the individual connection terminal and a bump electrode includes a first wiring of which a position of a pass-through wiring relaying the first surface and the second surface is within the first region. A second wiring of which a position of a pass-through wiring connecting the first surface and the second surface is within the second region.

5 Claims, 5 Drawing Sheets

(56) References Cited

U.S. PATENT DOCUMENTS

2014/0176646 A1\* 6/2014 Hirai .................... B41J 2/14233
347/71

FOREIGN PATENT DOCUMENTS

| JP | 2012-051253 A | 3/2012 |
| WO | 2014-132617 | 9/2014 |
| WO | 2016-143355 | 9/2016 |

\* cited by examiner

ELECTRONIC DEVICE

BACKGROUND

1. Technical Field

The present invention relates to an electronic device provided with a wiring substrate having wirings formed thereon.

2. Related Art

An electronic device includes a drive element such as a piezoelectric element to be deformed in response to an applied voltage, and the electronic device is applied to various types of devices, sensors, or the like. For example, a liquid ejecting apparatus ejects various types of liquid from a liquid ejecting head using the electronic device. Examples of the liquid ejecting apparatus include an image recording apparatus such as an ink jet printer and an ink jet plotter, but in recent years, the liquid ejecting apparatus has also been applied to various manufacturing apparatuses, by taking advantage of features that a very small amount of liquid can be accurately landed at a predetermined position. For example, the liquid ejecting apparatus has been applied to a display manufacturing apparatus that manufactures a color filter for a liquid crystal display, or the like, an electrode forming apparatus that forms electrodes in an organic electro luminescence (EL) display, a field emission display (FED), or the like, and a chip manufacturing apparatus that manufactures a bio-chip (a biochemical element). Then, a recording head for the image recording apparatus ejects liquid ink, and a color material ejecting head for the display manufacturing apparatus ejects respective color material solutions of Red (R), Green (G), and Blue (B). Further, an electrode material ejecting head for the electrode forming apparatus ejects liquid electrode materials, and a bio-organic material ejecting head for the chip manufacturing apparatus ejects a bio-organic material solution.

The liquid ejecting head includes an electronic device in which a pressure chamber formation substrate including a pressure chamber formed thereon in communication with a nozzle, a piezoelectric element (a type of a drive element) causing a pressure fluctuation in liquid inside the pressure chamber, a sealing plate spaced apart from the piezoelectric element, and the like are stacked. The piezoelectric element is driven by a drive signal supplied from a drive IC (also referred to as a driver IC). The drive IC is provided on the outside of the electronic device in the related art. For example, in the known technique, the drive IC is provided in a tape carrier package (TCP) that is connected to the electronic device (for example, see JP-A-2012-51253). A drive signal from the drive IC is supplied to the piezoelectric element through wirings formed in the TCP.

In recent years, with the miniaturization of the liquid ejecting head, a technique for bonding the drive IC on a sealing plate that covers the piezoelectric element has been developed. In this configuration, a plurality of terminals that are connected to the terminal of the drive IC are formed on a surface on one side (a drive IC side) of the sealing plate. Meanwhile, a plurality of terminals that are connected to the terminal of the piezoelectric element are formed on a surface of the other side (the opposite side of the drive IC side) of the sealing plate. The terminals formed on the surface on one side and the terminals formed on the surface of the other side are connected by a wiring formed over both surfaces of the sealing plate.

However, a center-to-center distance (pitch) of the adjacent terminals of the drive IC and the center-to-center distance (pitch) of the adjacent terminals of the piezoelectric element are unlikely to be aligned with each other for reasons of manufacturing or design. Therefore, it is considered to perform a so-called pitch conversion on one surface of the sealing plate, in which wiring is performed while gradually changing an inclination angle such that one end of a wiring, that connects the terminal on the drive IC side and the terminal on the piezoelectric element, is aligned with the pitch of the terminal on the same side as the one end, and the other end of the wiring is aligned with the pitch of the terminal on the same side as the other end. However, with an increase in the number of nozzles and a high density of nozzles, the number of terminals increases, and if the terminal pitch is narrowed, it is difficult to perform the pitch conversion without changing an interval between one terminal and the other terminal. In other words, as a wiring is positioned closer to the outside, among arranged wirings, the wiring has a steeper inclination relative to the arrangement direction of the terminal, and has difficulty in securing a sufficient wiring interval and a wiring width. If increasing the interval between the terminal on the drive IC side and the terminal on the piezoelectric element side in order to secure the wiring interval and the wiring width, the sizes of the sealing plate and the drive IC are increased, and as a result, it is difficult to miniaturize the electronic device.

SUMMARY

An advantage of some aspects of the invention is to provide an electronic device that can be miniaturized.

According to an aspect of the invention, an electronic device includes a wiring substrate including a first surface and a second surface, a drive element formation substrate provided with a plurality of drive elements being connected to the first surface, a drive IC that drives the drive elements being provided on a second surface that is on an opposite side of the first surface, in which the wiring substrate includes a first region and a second region on the second surface, a plurality of first terminals which receive a signal from the drive IC being arranged in a first direction in the first region, and the second region being in a position different from the first region, in which a plurality of second terminals that output the signal to the drive elements are arranged at a pitch different from a pitch of the first terminal in the first direction, in a region overlapping the second region in a plan view, on the first surface of the wiring substrate, and in which a wiring group connecting the first terminals and the second terminals includes a first wiring of which a position of a relay wiring portion relaying the first surface and the second surface is within the first region, and a second wiring of which a position of a relay wiring portion connecting the first surface and the second surface is within the second region.

In this case, in the wiring group configured with a plurality of first wirings, the relay wiring portion is provided in the first region on the first terminal side, such that it is possible to perform pitch conversion on the first surface side. Meanwhile, in the wiring group configured with a plurality of second wirings, the relay wiring portion is provided in the second region on the second terminal side, such that it is possible to perform pitch conversion on the second surface side. In other words, since the pitch conversion on the wiring group can separately be performed on both surfaces of the wiring substrate, it is possible to reduce the interval between the first terminal and the second terminal, while ensuring a sufficient wiring interval and wiring width. As a result, it is possible to miniaturize the wiring substrate, and to allow the electronic device to be miniaturized.

In the electronic device, it is preferable that the first wiring and the second wiring are arranged so as to be adjacent to each other in the first direction.

In this case, it is possible to efficiently widen the interval between the first wirings and the interval between the second wirings. As a result, it is possible to further reduce the interval between the first terminal and the second terminal.

In the electronic device, it is preferable that the second terminals each includes a resin layer provided on the first surface and a conductive layer of which at least a portion is provided in the resin layer, and a portion of the wiring group that is provided on the first surface is formed of the conductive layer.

In this case, the second terminal can have elasticity, and thus it is possible to more reliably enable conduction through the second terminal. Moreover, since it is possible to generate the conductive layer and the wiring group of the second terminal by the same process, the manufacturing becomes easy.

In the electronic device, it is preferable that a relay wiring portion of the second wiring is formed at a position spaced further apart from the first terminal than the second terminal.

In this case, it is possible to widen the wiring region (pitch conversion region) without changing the interval between the first terminal and the second terminal.

In the electronic device, it is preferable that a relay wiring portion of the first region and a relay wiring portion of the second region are pass-through wirings made of conductors which are formed inside pass-through holes passing through the wiring substrate in the thickness direction.

In this case, the first surface and the second surface can be relayed at a certain position on the wiring substrate, such that the degree of freedom of wiring layout can be increased.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the present invention will be described with reference to the accompanying drawings. Note that in the embodiments described below, various limits are presented as preferred specific embodiments of the invention, but the scope of the present invention is not limited to these embodiments, unless a particular description for limiting the invention is given in the following description. Further, in the following description, an ink jet printer (hereinafter, referred to as a printer) which is a type of a liquid ejecting apparatus equipped with an ink jet recording head (hereinafter, referred to as a recording head) which is a type of a liquid ejecting head provided with an electronic device according to the present invention will be described as an example.

Figure 1:
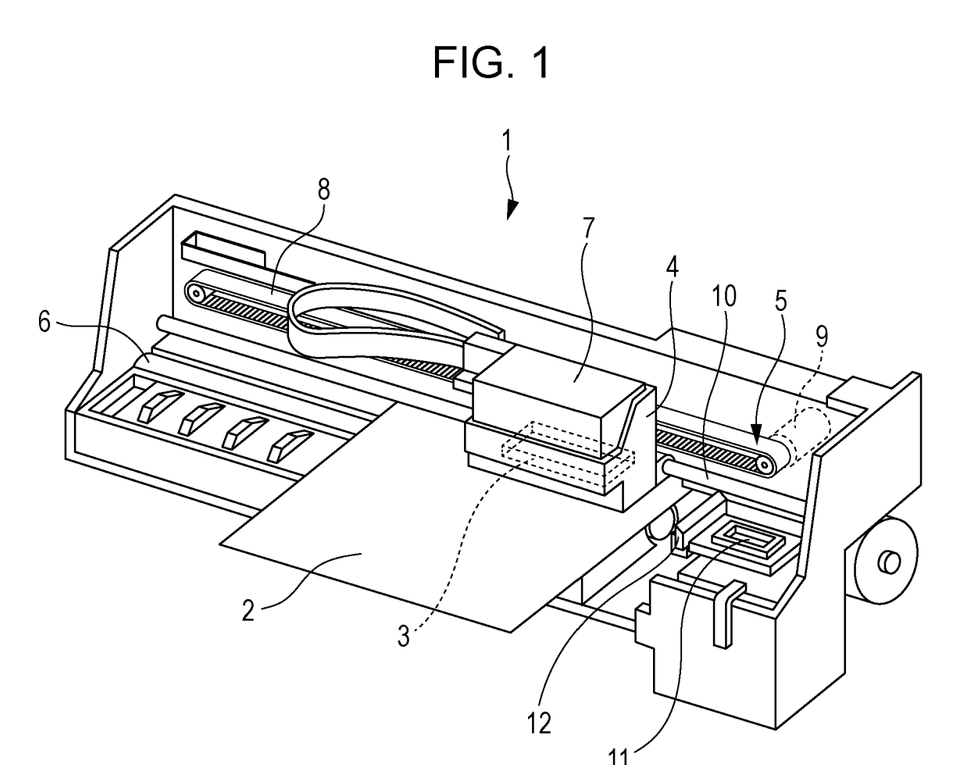
FIG. 1 is a perspective view illustrating the configuration of a printer.

The configuration of the printer 1 will be described with reference to FIG. 1. The printer 1 is an apparatus that records an image or the like by ejecting ink (a type of liquid) onto the surface of the recording medium 2 (a type of a landing target) such as a recording sheet. The printer 1 includes a recording head 3, a carriage 4 including the recording head 3 attached thereto, a carriage moving mechanism 5 that moves the carriage 4 in a main scanning direction, a transport mechanism 6 that transports the recording medium 2 in a sub-scanning direction, and the like. Here, the ink is stored in the ink cartridge 7 which is a liquid supply source. The ink cartridge 7 is detachably mounted on the recording head 3. In addition, a configuration can be employed in which an ink cartridge is disposed on the body side of a printer, and ink is supplied from the ink cartridge to a recording head through an ink supply tube.

The carriage moving mechanism 5 includes a timing belt 8. The timing belt 8 is driven by a pulse motor 9 such as a DC motor. Therefore, when the pulse motor 9 is operated, the carriage 4 is guided to a guide rod 10 that is installed in the printer 1, and reciprocates in the main scanning direction (in the width direction of the recording medium 2). The position of the carriage 4 in the main scanning direction is detected by a linear encoder (not illustrated) which is a type of position information detection means. The linear encoder transmits the detection signal, that is, an encoder pulse (a type of position information) to the control unit of the printer 1.

A home position that becomes a base point of the scanning of the carriage 4 is set further in the outer end region than the recording region within the moving range of the carriage 4. A cap 11 that seals a nozzle 22 that is formed on the nozzle surface (a nozzle plate 21) of the recording head 3, and a wiping unit 12 that wipes the nozzle surface are arranged in order from the end side in the home position.

Figure 2:
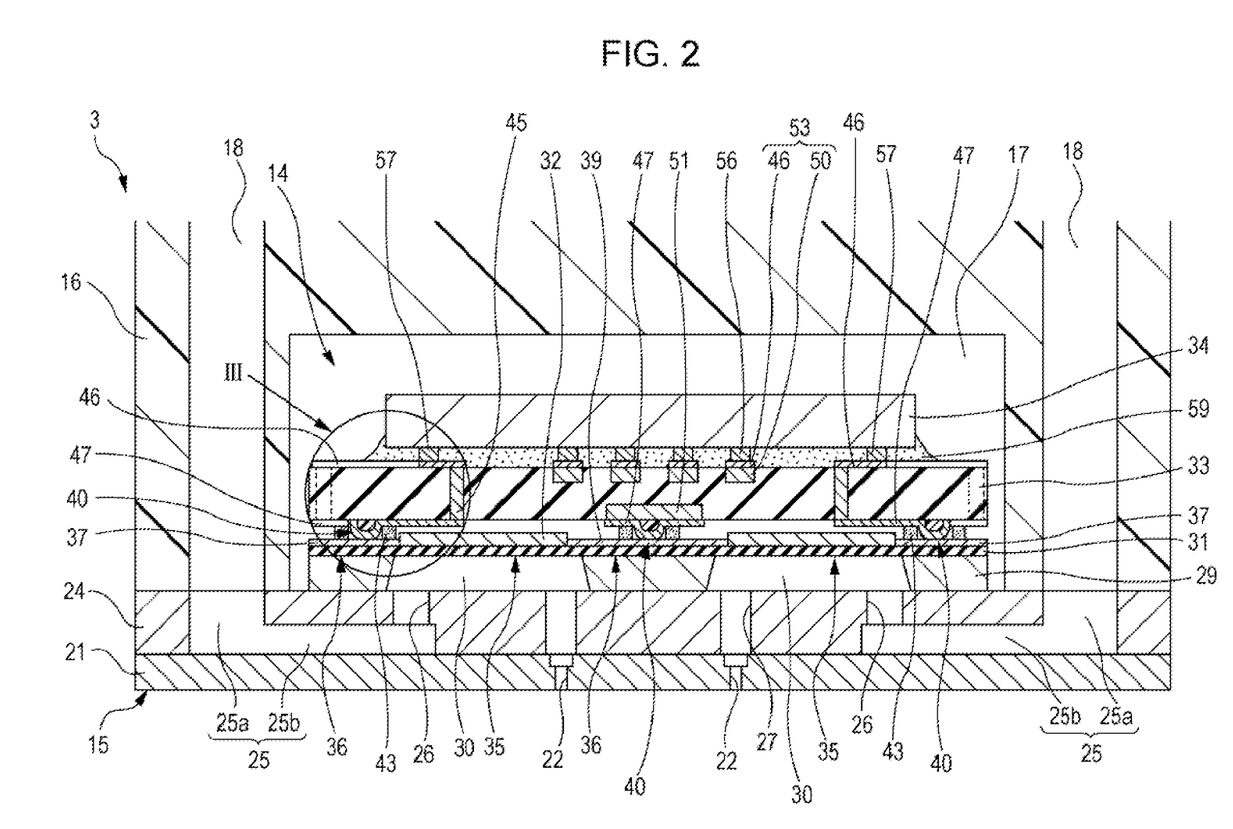
FIG. 2 is a cross-sectional view illustrating the configuration of a recording head.
Figure 3:
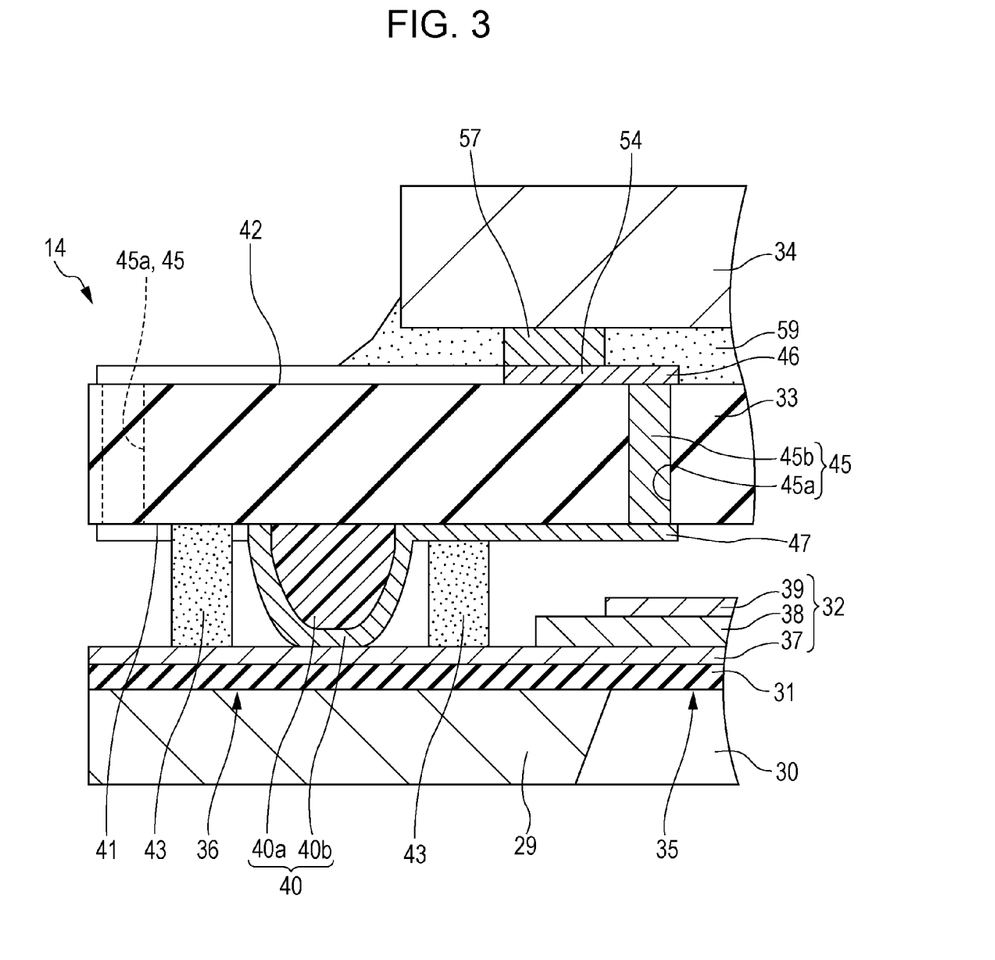
FIG. 3 is an enlarged cross-sectional view of a main portion of an electronic device.

Next, the recording head 3 will be described. FIG. 2 is a cross-sectional view illustrating the configuration of the recording head 3. FIG. 3 is an enlarged view of a region III in FIG. 2, and is an enlarged cross-sectional view of a main portion of an electronic device 14 which is built into the recording head 3. As illustrated in FIG. 2, the recording head 3 in the present embodiment is attached to the head case 16 in a state where the electronic device 14 and the flow path unit 15 are stacked. It should be noted that, for the sake of convenience, the stacking direction of respective members will be described as a vertical direction.

The head case 16 is a box-shaped member made of synthetic resin, and includes a reservoir 18 that supplies ink to each pressure chamber 30 formed therein. The reservoir 18 is a space that stores ink common to a plurality of the pressure chambers 30 which are arranged in parallel, and two reservoirs 18 are formed corresponding to the arrays of the pressure chambers 30 which are arranged in parallel in two arrays. An ink introduction path (not illustrated) for introducing the ink from the ink cartridge 7 side to the reservoir 18 is formed above the head case 16. An accommodating space 17, that is recessed in a rectangular parallelepiped shape from the lower surface to the middle, in the height direction of the head case 16, is formed on the lower surface side of the head case 16. It is configured that if a flow path unit 15 to be described later is bonded with the lower surface of the head case 16 in positioned state, the electronic device 14 (a pressure chamber formation substrate 29, a sealing plate 33, and the like) that is stacked on the communication substrate 24 is accommodated in the accommodating space 17.

The flow path unit 15 which is bonded to the lower surface of the head case 16 includes a communication substrate 24 and a nozzle plate 21. The communication substrate 24 is a plate member made of silicon, and is made of a silicon single crystal substrate in which the crystal plane orientation of the surfaces (upper and lower surfaces) is a (110) surface, in the present embodiment. As illustrated in FIG. 2, a common liquid chamber 25 which is in communication with the reservoir 18 and stores ink common to the respective pressure chambers 30, and a separate communication path 26 that individually supplies ink from the reservoir 18 to the respective pressure chambers 30 through the common liquid chamber 25 are formed by etching on the communication substrate 24. The common liquid chamber 25 is an elongated hollow portion along the nozzle array direction (corresponding to the first direction in the present invention), and the common liquid chambers 25 are formed in two arrays corresponding to the arrays of the pressure chambers 30 which are arranged in parallel in two arrays. The common liquid chamber 25 includes a first liquid chamber 25a passing through the thickness direction of the communication substrate 24, and a second liquid chamber 25b which is recessed halfway from the lower surface side to the upper surface side of the communication substrate 24 in the thickness direction of the communication substrate 24, while leaving a thin plate portion on the upper surface side. A plurality of separate communication paths 26 are formed along the arrangement direction of the pressure chamber 30, corresponding to the pressure chamber 30, in the thin plate portion of the second liquid chamber 25b. The separate communication path 26 is in communication with one end in the longitudinal direction of the corresponding pressure chamber 30, in a state where the communication substrate 24 and the pressure chamber formation substrate 29 are bonded.

A nozzle communication path 27 passing through the communication substrate 24 in the thickness direction is formed in the position on the communication substrate 24 corresponding to each nozzle 22. In other words, a plurality of nozzle communication paths 27 are formed along the nozzle array direction, corresponding to the nozzle arrays. The pressure chamber 30 and the nozzle 22 are in communication with each other through the nozzle communication path 27. The nozzle communication path 27 of the present embodiment is in communication with the end on the other side (on the opposite side of the separate communication path 26) in the longitudinal direction of the corresponding pressure chamber 30, in a state where the communication substrate 24 and the pressure chamber formation substrate 29 are joined.

The nozzle plate 21 is a substrate made of silicon (for example, a silicon single crystal substrate) that is bonded to the lower surface (the surface on the opposite side of the pressure chamber formation substrate 29) of the communication substrate 24. In the present embodiment, the opening on the lower surface side of the space which is the common liquid chamber 25 is sealed by the nozzle plate 21. Further, a plurality of nozzles 22 are provided linearly (in a row) on the nozzle plate 21. In the present embodiment, the nozzles are formed in two arrays corresponding to the arrays of the pressure chambers 30 which are formed in two arrays. A plurality of nozzles 22 (nozzle arrays) which are arranged in parallel are provided at an equal interval along the sub-scanning direction perpendicular to the main scanning direction, at a pitch (for example, 600 dpi) corresponding to the dot formation density, from the nozzle 22 on one side to the nozzle 22 on the other side. Further, the nozzle plate is joined to a region deviated inwardly from the common liquid chamber in the communication substrate, and the opening on the lower surface side of the space which is the common liquid chamber can be sealed, for example, by members such as a compliance sheet having flexibility. In this way, the nozzle plate can be as small as possible.

The electronic device 14 of the present embodiment is a thin plate-like device that functions as an actuator generating a pressure variation in the ink in each pressure chamber 30. As illustrated in FIGS. 2 and 3, the electronic device 14 is formed into a unit in which a pressure chamber formation substrate 29, a vibration plate 31, a piezoelectric element 32 (corresponding to the drive element in the present invention), a sealing plate 33, and a drive IC 34 are stacked. In addition, the electronic device 14 is formed to be smaller than the accommodating space 17 so as to be accommodated in the accommodating space 17.

The pressure chamber formation substrate 29 is a rigid plate made of silicon, and is made of a silicon single crystal substrate in which the crystal plane orientation of the surfaces (upper and lower surfaces) is a (110) surface, in the present embodiment. A portion of the pressure chamber formation substrate 29 is completely removed in the thickness direction by etching, and a plurality of spaces to become the pressure chambers 30 are arranged in parallel in the nozzle array direction. The lower part of the space is partitioned by the communication substrate 24, and the upper part thereof is partitioned by the vibration plate 31, thereby constituting the pressure chambers 30. Further, this space, that is, the pressure chambers 30 are formed in two arrays corresponding to the nozzle arrays which are formed in two arrays. Each pressure chamber 30 is an elongated hollow portion in a direction perpendicular to the nozzle array direction, and is in communication with the separate communication path 26 in one end in the longitudinal direction, and is in communication with the nozzle communication path 27 in the other end.

The vibration plate 31 is a thin film-like member having elasticity, and is stacked on the upper surface (the surface on the opposite side of the communication substrate 24 side) of the pressure chamber formation substrate 29. The upper opening of the space which becomes the pressure chamber 30 is sealed by the vibration plate 31. In other words, the pressure chamber 30 is partitioned by the vibration plate 31. The portion corresponding to the pressure chamber 30 (specifically, the upper opening of the pressure chamber 30) in the vibration plate 31 functions as a displacement portion which is displaced in the direction away from the nozzle 22 or in the direction close thereto in accordance with the flexural deformation of the piezoelectric element 32. In other words, the region corresponding to the upper opening of the pressure chamber 30 in the vibration plate 31 becomes a drive region 35 for which flexural deformation is allowed. Meanwhile, the region deviated from the upper opening of the pressure chamber 30 in the vibration plate 31 becomes a non-drive region 36 for which flexural deformation is inhibited.

Incidentally, the vibration plate 31 is configured with, for example, an elastic film made of silicon dioxide ($SiO_2$) formed on the upper surface of the pressure chamber formation substrate 29, and an insulating film made of zirconium oxide ($ZrO_2$) formed on the elastic film. Then, the piezoelectric elements 32 are respectively stacked on regions corresponding to the respective pressure chambers 30 on the insulating film (the surface on the opposite side of the pressure chamber formation substrate 29 side of the vibration plate 31), that is, drive regions 35. The respective piezoelectric elements 32 are formed in two arrays in the nozzle array direction, corresponding to the pressure chambers 30 which are arranged in parallel in two arrays in the nozzle array direction. In addition, the pressure chamber formation substrate 29 and the vibration plate 31 stacked thereon correspond to the drive element formation substrate of the present invention.

The piezoelectric element 32 of the present embodiment is a so-called flexural mode piezoelectric element. As illustrated in FIG. 3, the piezoelectric element 32 is configured, for example, by sequentially stacking a lower electrode layer 37 (an individual electrode), a piezoelectric layer 38, and an upper electrode layer 39 (common electrode) on a vibration plate 31. If an electric field corresponding to a potential difference between both electrodes is applied to between the lower electrode layer 37 and the upper electrode layer 39, the piezoelectric element 32 configured in this manner is subjected to flexural deformation in a direction away from the nozzle 22 or in a direction close thereto. As illustrated in FIG. 3, the other end of the lower electrode layer 37 (the outer side in the longitudinal direction of the piezoelectric element 32) extends from the drive region 35 to the non-drive region 36, over the region on which the piezoelectric layer 38 is stacked. Meanwhile, as illustrated in FIG. 2, the end of the one side of the upper electrode layer 39 (the inner side in the longitudinal direction of the piezoelectric element 32) extends from the drive region 35 to the non-drive region 36 between the arrays of the piezoelectric element 32, over the region on which the piezoelectric layer 38 is stacked. In other words, in the longitudinal direction of the pressure chamber 30, the upper electrode layer 39 extends to the non-drive region 36 on one side, and the lower electrode layer 37 extends to the non-drive region 36 on the other side. Bump electrodes 40 (described later) are respectively bonded to the lower electrode layer 37 and the upper electrode layer 39. Further, in the present embodiment, the upper electrode layer 39 that extends from the array of the piezoelectric element 32 on one side and the upper electrode layer 39 that extends from the array of the piezoelectric element 32 on the other side are connected in the non-drive region 36 between the arrays of the piezoelectric elements 32. In other words, the upper electrode layer 39 common to the piezoelectric elements 32 on both sides is formed in the non-drive region 36 between the arrays of the piezoelectric elements 32.

As illustrated in FIGS. 2 and 3, the sealing plate 33 (corresponding to the wiring substrate in the present invention) is a plate-like silicon substrate which is spaced apart from the vibration plate 31 (or the piezoelectric element 32). In the present embodiment, the sealing plate 33 is made of a silicon single crystal substrate in which the crystal plane orientation of the surfaces (the upper surface and the lower surface) is a (110) surface. The drive IC 34 that drives the piezoelectric element 32 is disposed on the second surface 42 (the upper surface) on the opposite side of the first surface 41 (the lower surface) which is the surface on the vibration plate 31 side of the sealing plate 33. In other words, the vibration plate 31 on which the piezoelectric element 32 is stacked is connected to the first surface 41 of the sealing plate 33, and the drive IC 34 is provided on the second surface 42.

A plurality of bump electrodes 40 that outputs drive signals from the drive IC 34 or the like to the piezoelectric element 32 side are formed on the first surface 41 of the sealing plate 33 in the present embodiment. As illustrated in FIG. 2, the plurality of bump electrodes 40 are respectively formed at a position corresponding to one lower electrode layer 37 (individual electrode) extending to the outside of one piezoelectric element 32, a position corresponding to the other lower electrode layer 37 (individual electrode) extending to the outside of the other piezoelectric element 32, and a position corresponding to the upper electrode layer 39 (common electrode) common to the plurality of piezoelectric elements 32 that are formed between arrays of piezoelectric elements 32 on both sides, in the nozzle array direction. Each bump electrode 40 is connected to the lower electrode layer 37 and the upper electrode layer 39 which correspond thereto.

The bump electrode 40 in the present embodiment has elasticity, and projects toward the vibration plate 31 side from the surface of the sealing plate 33. Specifically, as illustrated in FIG. 3, the bump electrode 40 includes an internal resin 40a having elasticity (corresponding to a resin layer in the present invention) and a conductive film 40b (corresponding to a conductive layer in the present invention) formed of a lower surface-side wiring 47 (described later) that covers the surface of at least a part of the internal resin 40a. The internal resin 40a is formed into a projection, on the surface of the sealing plate 33 in the nozzle array direction. Further, a plurality of the conductive films 40b that are conductive to the lower electrode layer 37 (individual electrode) are formed in the nozzle array direction, corresponding to the piezoelectric elements 32 which are arranged in parallel in the nozzle array direction. In other words, a plurality of bump electrodes 40 that are conductive to the lower electrode layer 37 are formed along the nozzle array direction. Each conductive film 40b extends from the internal resin 40a to either the piezoelectric element 32 side, or the opposite side of the piezoelectric element 32, so as to become a lower surface-side wiring 47. The end on the opposite side of the bump electrode 40 of the lower surface-side wiring 47 is connected to a pass-through wiring 45 to be described later. In addition, the bump electrode 40 corresponds to the second terminal in the present invention.

As illustrated in FIG. 2, a plurality of bump electrodes 40 corresponding to the upper electrode layer 39 of the present embodiment are formed on the lower surface-side buried wiring 51 buried in the first surface 41 of the sealing plate 33. Specifically, the internal resin 40a of a narrower width than the width (the dimension in the direction perpendicular to the nozzle array direction) of the lower surface-side buried wiring 51 is formed in the same direction, on the lower surface-side buried wiring 51 which extends along the nozzle array direction. The conductive film 40b protrudes on both sides in the width direction of the internal resin 40a from above the internal resin 40a so as to be conductive to the lower surface-side buried wiring 51. A plurality of conductive films 40b are formed in the nozzle array direction. In other words, a plurality of bump electrodes 40 which are conductive to the upper electrode layer 39 are formed along the nozzle array direction. Further, for example, resin such as polyimide resin is used as the internal resin 40a.

As illustrated in FIG. 2, the sealing plate 33 and the pressure chamber formation substrate 29 (for more details, the pressure chamber formation substrate 29 on which the vibration plate 31 and the piezoelectric element 32 are stacked) are joined by a photosensitive adhesive 43 having properties of both thermosetting and photosensitivity, in a state where the bump electrode 40 is interposed therebetween. In the present embodiment, the photosensitive adhesive 43 is formed on both sides of each bump electrode 40 in the direction perpendicular to the nozzle array direction.

Further, each photosensitive adhesive 43 is formed into a band shape along the nozzle array direction in a state of being away from the bump electrode 40. Further, for example, resins containing epoxy resins, acrylic resins, phenolic resins, polyimide resins, silicone resins, styrene resins or the like as a main component are preferably used as the photosensitive adhesive 43.

Further, as illustrated in FIG. 2, a plurality of (four in the present embodiment) power supply wirings 53 that supplies the power supply voltage or the like (for example, VDD1 (a power supply of the low-voltage circuit), VDD2 (a power supply of the high-voltage circuit), VSS1 (a power supply of the low-voltage circuit), and VSS2 (a power supply of the high-voltage circuit)) to the drive IC 34 are formed in the central portion of the second surface 42 of the sealing plate 33. The power supply wiring 53 is configured with an upper surface-side buried wiring 50 that is buried in the second surface 42 of the sealing plate 33, and an upper surface-side wiring 46 stacked so as to cover the upper surface-side buried wiring 50. The power supply terminal 56 of the corresponding drive IC 34 is electrically connected to the upper surface-side wiring 46 of the power supply wiring 53. Further, the lower surface-side buried wiring 51 and the upper surface-side buried wiring 50 are made of a metal such as copper (Cu). Further, as illustrated in FIG. 3, the individual terminal 57 of the drive IC 34 is connected to and an individual connection terminal 54 for receiving a signal from the drive IC 34 (corresponding to the first terminal in the present invention) is formed in the region (a region deviated to the outside from the region having the power supply wiring 53 formed therein) on both ends of the second surface 42 of the sealing plate 33. An upper surface-side wiring 46 extends from each individual connection terminal 54 to either the piezoelectric element 32 side or the opposite side of the piezoelectric element 32 side. Then, the end on the opposite side of the individual connection terminal 54 of the upper surface-side wiring 46 is connected to the corresponding lower surface-side wiring 47 through a through wiring 45 to be described later.

The through wiring 45 (corresponding to the relay wiring portion in the present invention) is a wiring relaying the first surface 41 and the second surface 42 of the sealing plate 33, and is configured with a pass-through hole 45a that penetrates the sealing plate 33 in the thickness direction, and a conductor portion 45b made of a conductor such as metal formed in the interior of the pass-through hole 45a. The conductor portion 45b in the present embodiment is made of metal such as copper (Cu), and is filled inside the pass-through hole 45a. A portion of the conductor portion 45b that is exposed to the opening on the first surface 41 side of the pass-through hole 45a is covered with the corresponding lower surface-side wiring 47. Meanwhile, a portion of the conductor portion 45b that is exposed to the opening on the second surface 42 side of the pass-through hole 45a is covered with the corresponding upper surface-side wiring 46. Therefore, the upper surface-side wiring 46 which extends from the individual connecting terminal 54, and the lower surface-side wiring 47 which extends from the bump electrode 40 corresponding thereto are electrically connected through the pass-through wiring 45. In other words, the individual connection terminal 54 and the bump electrode 40 are connected by a series of wirings including the upper surface-side wiring 46, the pass-through wiring 45 and the lower surface-side wiring 47. Note that the conductor portion 45b of the pass-through wiring 45 is not required to be filled in the pass-through hole 45a, and may be formed in a part of at least the pass-through hole 45a. Further, the configuration of the wiring group connecting each individual connection terminal 54 with each bump electrode 40 will be described later in detail.

The drive IC 34 is an IC chip for driving the piezoelectric element 32, and is stacked on the second surface 42 of the sealing plate 33 through the adhesive 59 such as an anisotropic conductive film (ACF). As illustrated in FIG. 2, a plurality of power supply terminals 56 connected to the power supply wiring 53 and individual terminals 57 connected to the individual connection terminal 54 are arranged in parallel along the nozzle array direction on the surface on the sealing plate 33 side of the drive IC 34. The individual terminal 57 is a terminal for outputting the individual signal corresponding to each piezoelectric element 32. In the embodiment, the individual terminals 57 are arranged in parallel in two arrays on both sides of the power supply terminal 56, corresponding to the arrays of the piezoelectric element 32 which are arranged in parallel in two arrays. In the array of the individual terminal 57, a center-to-center distance of the adjacent individual terminal 57 (in other words, a pitch) is formed to be as small as possible, and is formed smaller than the pitch of the bump electrode 40 in the present embodiment. This makes it possible to miniaturize the drive IC 34.

The recording head 3 which is formed in this manner introduces ink from the ink cartridge 7 to the pressure chamber 30, through an ink introduction path, the reservoir 18, the common liquid chamber 25, and the separate communication path 26. In this state, the drive signal from the drive IC 34 is supplied to the piezoelectric element 32 through each wiring formed on the sealing plate 33 so as to drive the piezoelectric element 32, and causes pressure fluctuations in the pressure chamber 30. Since the pressure fluctuation is used, the recording head 3 ejects ink droplets from the nozzle 22 through the nozzle communication path 27.

Figure 4:
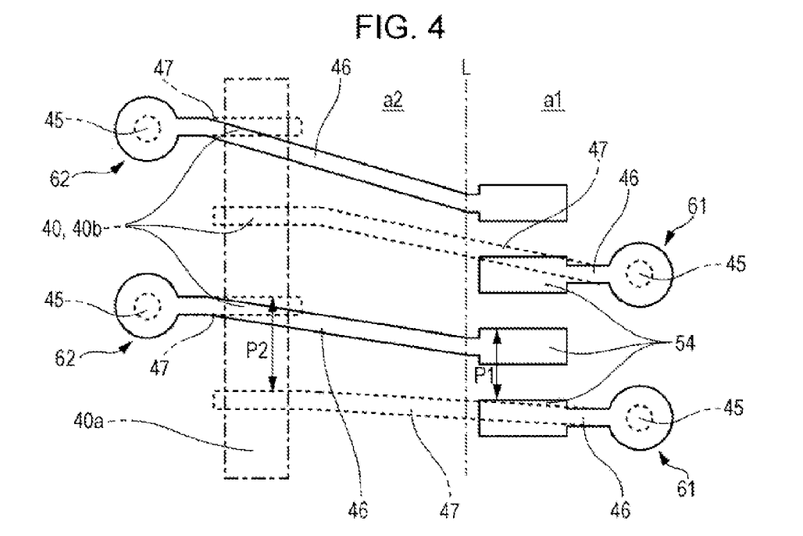
FIG. 4 is a plan view of a sealing plate.
Figure 5:
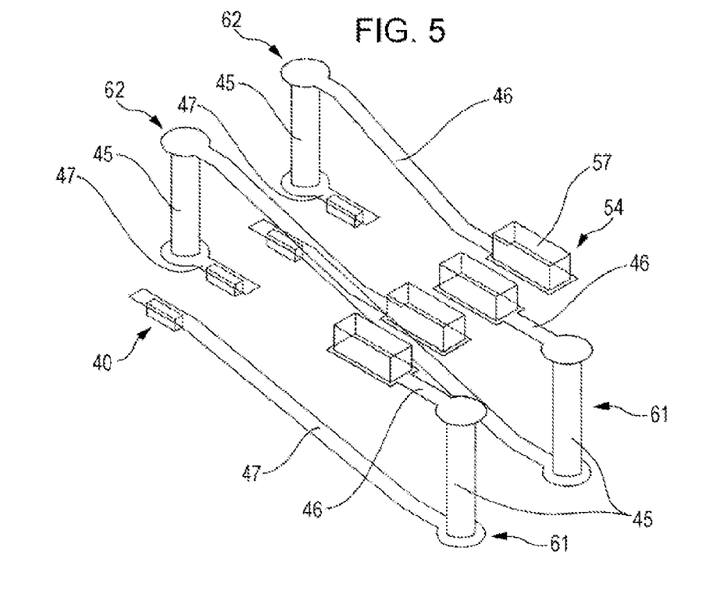
FIG. 5 is a perspective view illustrating the configuration of a wiring.

Next, a description will be made in detail regarding a wiring group which connects the individual connection terminal 54 formed on the sealing plate 33 and the bump electrode 40, in particular, a positional relationship of the individual connection terminal 54, the upper surface-side wiring 46, the pass-through wiring 45, the lower surface-side wiring 47 and the bump electrode 40. Further, in the following description, a description will be focused on one wiring group corresponding to the region III, among wiring groups corresponding to the individual electrodes which are formed on both end sides of the sealing plate 33. FIG. 4 is a plan view from the second surface 42 (the upper surface) side of the sealing plate. FIG. 5 is a perspective view illustrating the configuration of a wiring group. FIG. 5 illustrates the sealing plate 33 in a see-through manner. Further, the bump electrode 40 depicted as a rectangular parallelepiped on lower surface-side wiring 47, for the sake of simplicity in FIG. 5, but in fact, is formed by stacking the lower surface-side wiring 47 on the internal resin 40a as described above.

The individual connection terminal 54 and the bump electrode 40 are disposed at an equal interval along the nozzle array direction. In the present embodiment, as illustrated in FIG. 4, the pitch P1 of the individual connection terminal 54 is formed smaller than the pitch P2 of the bump electrode 40. Further, the individual connection terminal 54 and the bump electrode 40 are spaced at an interval along a direction perpendicular to the nozzle array direction. Specifically, the individual connection terminal 54 is formed in the first region a1 in the inside (the piezoelectric element 32 side), and the bump electrode 40 is formed in the region on the first surface 41 side overlapping the second region a2 in the outside (the opposite side of the piezoelectric element 32) in a plan view, among regions obtained by dividing the second surface 42 with an imaginary line L which is parallel to the nozzle array direction. In the present embodiment, the individual connection terminal 54 is formed in the vicinity of the imaginary line L. In other words, the imaginary line L is set closer to the individual connection terminal 54 between the bump electrode 40 and the individual connection terminal 54.

A wiring group, that connects each individual connection terminal 54 and each bump electrode 40, includes a first wiring 61 in which the position of the pass-through wiring 45 is within the first region a1, and a second wiring 62 in which the position of the pass-through wiring 45 is within the second region a2. Specifically, the first wiring 61 is configured with the upper surface-side wiring 46 that extends to the opposite side of the bump electrode 40 along the direction perpendicular to the nozzle array direction from the individual connection terminal 54 on the second surface 42, the pass-through wiring 45 formed within the first region a1, and a lower surface-side wiring 47 connecting from the pass-through wiring 45 to the corresponding bump electrode 40 on the first surface 41. Further, the second wiring 62 is configured with the upper surface-side wiring 46 that extends towards the corresponding bump electrode 40 from the individual connection terminal 54 on the second surface 42, the pass-through wiring 45 formed at a position spaced from the individual connection terminal 54 than the bump electrode 40 within the second region a2, and a lower surface-side wiring 47 that extends in a direction perpendicular to the nozzle array direction from the pass-through wiring 45 to the corresponding bump electrode 40 on the first surface 41. In the present embodiment, as illustrated in FIGS. 4 and 5, the first wiring 61 and the second wiring 62 are disposed so as to be adjacent to each other in the nozzle array direction. In other words, the first wiring 61 and second wiring 62 are arranged alternately along the nozzle array direction.

In this way, since the pass-through wiring 45 out of a first wiring group including a plurality of first wirings 61 is provided in the first region a1 on the individual connection terminal 54 side pitch conversion can be performed on the first surface 41 side by the lower surface-side wiring 47. Meanwhile, since the pass-through wiring 45 out of a second wiring group including a plurality of second wirings 62 is provided in the second region a2 on the bump electrode 40 side, pitch conversion can be performed on the second surface 42 side by the upper surface-side wiring 46. In other words, since the pitch conversion by the wiring group can be performed on the both surfaces of the wiring substrate, it is possible to reduce the interval between the bump electrode 40 and the individual connection terminal 54, while securing sufficient wiring interval and wiring width (the interval between the upper surface-side wirings 46 and the width of the upper surface-side wiring 46, and the interval between the lower surface-side wirings 47 and the width of the lower surface-side wiring 47). As a result, it is possible to reduce the size of the sealing plate 33 while suppressing the disconnection or short circuit of the first wiring 61 and the second wiring 62, and thus the electronic device 14 can be miniaturized. Further, as illustrated in FIG. 3, since one pass-through wiring 45, that is, the pass-through wiring 45 of the first wiring 61 is disposed in the region that overlaps the drive IC 34, a part of the wiring region (pitch conversion region) overlaps the drive IC 34. Thus, it is possible to reduce a wiring region (pitch conversion region) on the outside of the region that overlaps the drive IC 34, and it is possible to further reduce the size of the sealing plate 33.

Further, in the present embodiment, since the first wiring 61 and the second wiring 62 are arranged so as to be adjacent to each other in the first direction, it is possible to efficiently widen the interval between the first wirings 61 and the interval between the second wirings 62. As a result, it is possible to further reduce the interval between the bump electrode 40 and the individual connection terminal 54. Further, since the pass-through wiring 45 of the second wiring 62 is formed at a position spaced from the individual connection terminal 54 than the bump electrode 40, it is possible to widen the wiring region (pitch conversion region) while the interval between the bump electrode 40 and the individual connection terminal 54 is not changed. Further, since the first surface 41 and the second surface 42 are relayed by the pass-through wiring 45, it is possible to relay the first surface 41 and the second surface 42 at any position of the sealing plate 33. Thus, it is possible to increase the degree of freedom of wiring layout. Further, since the bump electrode 40 is configured with the internal resin 40a, and the conductive film 40b of which at least a part is stacked on the internal resin 40a, it is possible to impart elasticity to the bump electrode 40, and the conduction by the bump electrode 40 can be made more reliably. In addition, since the lower surface-side wiring 47 stacked on the first surface 41 is formed on the same layer as the conductive film 40b of the bump electrode 40, the lower surface-side wiring 47 and the conductive film 40b can be generated in the same process, and the manufacturing is facilitated.

In addition, although the above description is focused on one wiring group corresponding to the region III, among the wiring groups formed on both ends of the sealing plate 33, the other wiring group is formed in the similar manner. In the present embodiment, the wiring groups at both ends are provided symmetrically with respect to a virtual straight line along the nozzle array direction.

Next, a description will be made about a method for manufacturing the above-mentioned recording head 3, in particular, the electronic device 14. A silicon single crystal substrate (silicon wafer) including a plurality of regions formed therein which are the sealing plates 33 and a silicon single crystal substrate (silicon wafer) including the vibration plate 31 and the piezoelectric element 32 stacked thereon, and including a plurality of regions formed therein which are the pressure chamber formation substrate 29 are bonded to each other, are bonded to the drive IC 34 at a corresponding position, and are cut into individual pieces, thereby obtaining the electronic device 14 of the present embodiment.

To be more specific, first, recesses for forming the upper surface-side buried wiring 50 and the lower surface-side buried wiring 51 are formed on both surfaces of the silicon single crystal substrate, by a photolithography process and an etching process, on the silicon single crystal substrate of the sealing plate 33 side. Specifically, recesses are formed by patterning a photoresist on the silicon single crystal substrate and performing dry etching. Next, a pass-through hole 45a is formed by the photolithography process and the etching process. Specifically, a portion of the surface of the silicon single crystal substrate in which the pass-through hole 45a is formed is exposed by patterning a photoresist. Subsequently, a hole of a desired depth is formed in the exposed portion by dry etching. Then the photoresist is removed, and an insulating film is formed on the side wall of the pass-through hole 45a. In addition, it is possible to use various methods such as a CVD method, a method of forming a silicon oxide film by thermal oxidation, a method of coating and curing resin, as a method for forming an insulating film. Subsequently, the upper surface-side buried wiring 50, the lower surface-side buried wiring 51, and the electrode material that becomes the conductor portion 45b of the pass-through wiring 45 are formed on both surfaces of the silicon single crystal substrate and in the pass-through hole 45a, by an electrolytic plating method. Specifically, a seed layer for forming the electrode material is formed, and the electrode material is formed by electrolytic copper plating, with the seed layer as an electrode. Note that it is preferable to form a film for improving the adhesion and barrier properties between the substrates under the seed layer. In addition, it is desirable to make the seed layer from copper (Cu), and as an adhesion film or a barrier film from titanium (Ti), titanium nitride (TiN), titanium tungsten (TiW), tantalum (Ta), tantalum nitride (TaN), or the like, by using a sputtering method or a CVD method. Furthermore, the electrode material may be formed by embedding a material capable of conducting the upper surface and lower surface in the recess and the pass-through hole 45a, by using a method such as an electroless plating or a conductive paste printing, without depending on the electrolytic copper plating, as the method of forming an electrode material.

Next, the surface of the silicon single crystal substrate is exposed, by removing the copper (Cu) deposited on the upper surface of the silicon single crystal substrate, by using a chemical mechanical polishing (CMP) method. Further, the conductor portion 45b of the pass-through wiring 45 is exposed by removing the lower surface of the silicon single crystal substrate to a predetermined thickness by a back grinding method, and by finally grinding the silicon single crystal substrate by using the CMP method or the like. In this manner, the upper surface-side buried wiring 50, the lower surface-side buried wiring 51, and the pass-through wiring 45 are formed on the silicon single crystal substrate. If these wirings 50, 51, and 45 are formed, an insulating film such as a silicon oxide film is formed on the lower surface of the silicon single crystal substrate. Then, the photoresist is underwent patterning, the lower surface-side buried wiring 51 and the pass-through wiring 45 are exposed by dry etching or wet etching, and the photoresist is removed. Thereafter, a resin film is deposited on the lower surface of the silicon single crystal substrate, the internal resin 40a is formed by the photolithography process and the etching process, and the corners are rounded by melting the internal resin 40a by heating. Finally, the upper surface-side wiring 46 and the lower surface-side wiring 47 which are re-wiring are formed on both surfaces of the substrate. Specifically, a re-wiring layer is formed on entire one surface of the silicon single crystal substrate, and the re-wiring layer is underwent patterning by the photolithography process and the etching process, such that the wiring of the upper surface-side wiring 46 or the lower surface-side wiring 47 is formed. Further, simultaneously with the formation of the lower surface-side wiring 47, the bump electrode 40 is also formed. Thus, a plurality of regions which are the sealing plate 33 corresponding to each recording head 3 are formed on the silicon single crystal substrate. In addition, it is preferable to form the outermost surface with gold (Au), as the material for the re-wiring layer, but without being limited thereto, the outermost surface may be formed by using commonly used materials (Ti, Al, Cr, Ni, Cu, or the like). Further, a method for forming the upper surface-side wiring 46, the lower surface-side wiring 47, and the pass-through wiring 45 on the sealing plate 33 is not limited to the method described above, and the wirings also be formed by the generally available manufacturing method.

Meanwhile, first, the vibration plate 31 is stacked on the surface (the surface on the opposite side of the sealing plate 33 side) on the silicon single crystal substrate on the pressure chamber formation substrate 29 side. Next, the piezoelectric element 32 is formed by sequentially patterning the lower electrode layer 37, the piezoelectric layer 38, the upper electrode layer 39, and the like, by the semiconductor process. Thus, a plurality of regions which are the pressure chamber formation substrate 29 corresponding to respective recording heads 3, on the silicon single crystal substrate. Thus, if the sealing plate 33 and the pressure chamber formation substrate 29 are formed on each silicon single crystal substrate, the photosensitive adhesive layer is deposited on the surface (the surface on the sealing plate 33 side) of the silicon single crystal substrate on the pressure chamber formation substrate 29 side, and the photosensitive adhesive 43 is formed at a predetermined position by a photolithography process. Specifically, the vibration plate 31 is coated with a liquid photosensitive adhesive having photosensitivity and thermosetting by using a spin coater or the like, and is heated so as to form a photosensitive adhesive layer. Then, the shape of the photosensitive adhesive 43 is subjected to patterning at a predetermined position by exposing and developing the photosensitive adhesive layer.

If the photosensitive adhesive 43 is formed, both silicon single crystal substrates are bonded. Specifically, any one silicon single crystal substrate is moved relatively toward the other silicon single crystal substrate, such that the photosensitive adhesive 43 is interposed between both silicon single crystal substrates and bonded thereto. In this state, both the silicon single crystal substrates are pressurized in the vertical direction against the elastic restoring force of the bump electrode 40. Thus, the bump electrode 40 is crushed, and the lower electrode layer 37, the upper electrode layer 39, and the like on the pressure chamber formation substrate 29 side can reliably be in a conducted state. Then, heating to the curing temperature of the photosensitive adhesive 43 is performed, while applying a pressure. As a result, in a state where the bump electrode 40 is crushed, the photosensitive adhesive 43 is cured, and both silicon single crystal substrates are bonded.

If both silicon single crystal substrates are bonded, the silicon single crystal substrate of the pressure chamber formation substrate 29 side is polished from the lower surface side (the opposite side of the silicon single crystal substrate side of the sealing plate 33 side), the silicon single crystal substrate on the pressure chamber formation substrate 29 side is thinned. Thereafter, the pressure chamber 30 is formed on the silicon single crystal substrate on the thinned pressure chamber formation substrate 29 side by the photolithography process and etching process. Then, the drive IC 34 is bonded to the upper surface side of the silicon single crystal substrate side on the sealing plate 33 side by using the adhesive 59. Finally, the bonded one is cut into individual electronic devices 14 through scribing along a predetermined scribing line. Further, the electronic device 14 is produced by bonding two silicon single crystal substrates and dicing the bonded substrates by using this method, but is not limited thereto. For example, after the sealing plate 33 and the pressure chamber formation substrate 29 are first respectively diced, the diced sealing plate 33 and pressure chamber formation substrate 29 may be bonded. Further, after the respective silicon single crystal substrates are diced, the sealing plate 33 and the pressure chamber formation substrate 29 may be formed on each of the diced substrates.

Then, the electronic device 14 which is produced by the process is positioned and fixed in the flow path unit 15 (communication substrate 24) by using the adhesive or the like. Then, the recording head 3 is produced by bonding the head case 16 and the flow path unit 15, in a state where the electronic device 14 is housed in the accommodating space 17 of the head case 16.

However, in the above-mentioned first embodiment, the pass-through wiring 45 of the first wiring 61 is provided on the inner side (the opposite side of the bump electrode 40) than the individual connection terminal 54, but is not limited thereto. As long as the pass-through wiring of the first wiring is disposed within the first region, and the pass-through wiring of the second wiring is disposed within the second region, any configuration is possible.

Figure 6:
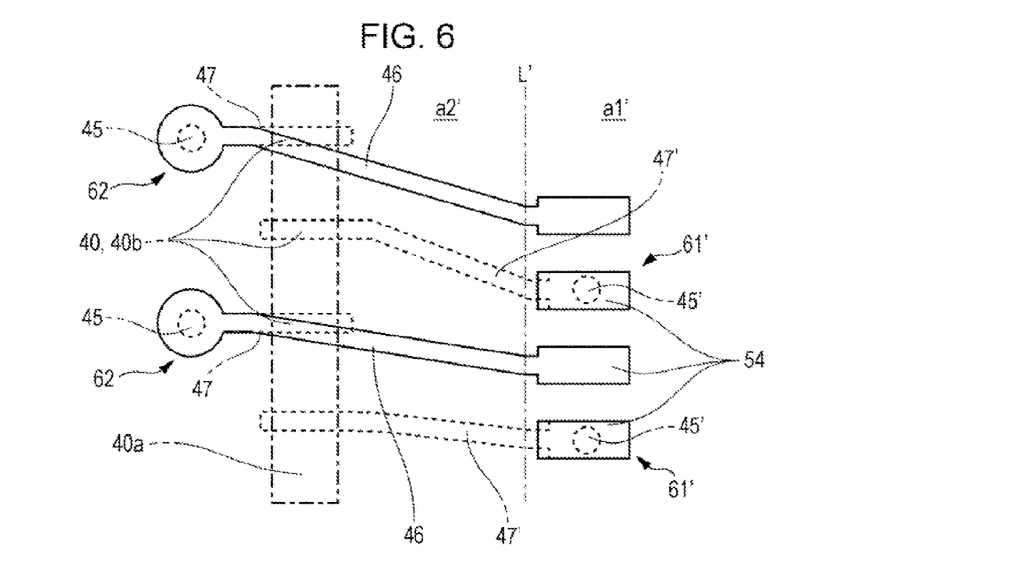
FIG. 6 is a plan view of a wiring substrate in a second embodiment.

For example, in a second embodiment illustrated in FIG. 6, the pass-through wiring 45' of the first wiring 61' is disposed immediately under the individual connection terminal 54. Specifically, the first wiring 61' is configured with a pass-through wiring 45' that is formed within a first region a1' which is a position overlapping the individual connection terminal 54, and a lower surface-side wiring 47' connecting the pass-through wiring 45' to the corresponding bump electrode 40 on the first surface 41. Since the imaginary line L' of this embodiment is set closer to the individual connection terminal 54 between the bump electrode 40 and the individual connection terminal 54 similar to the above-mentioned first embodiment, the first region a1' and the second region a2' are the same as in the above-mentioned first embodiment. Since other configurations are the same as the above-mentioned first embodiment, a description thereof will be omitted.

Figure 7:
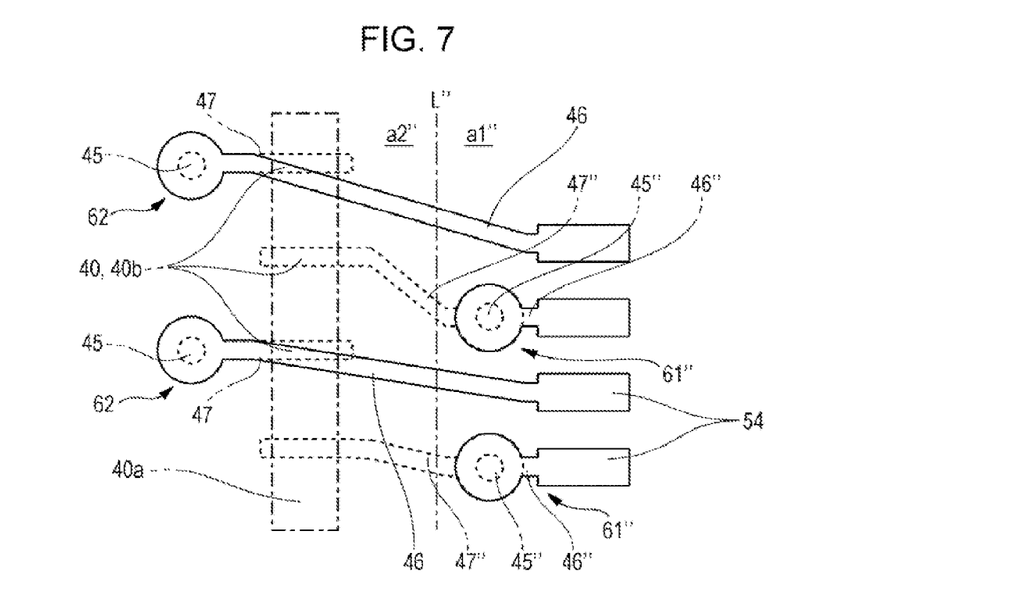
FIG. 7 is a plan view of a wiring substrate in a third embodiment.

Further, in a third embodiment illustrated in FIG. 7, the pass-through wiring 45" of the first wiring 61" is disposed on the outer side (the bump electrode 40 side) than the individual connection terminal 54. Specifically, the first wiring 61" is configured with an upper surface-side wiring 46" that extends to the bump electrode 40 side along the direction perpendicular to the nozzle array direction from the individual connection terminal 54 on the second surface 42, a pass-through wiring 45" formed within a first region a1" which is an end on the opposite side of the individual connection terminal 54 of the upper surface-side wiring 46", and a lower surface-side wiring 47" connecting the pass-through wiring 45" to the corresponding bump electrode 40 on the first surface 41. In addition, the imaginary line L" of this embodiment is set in an approximately midway between the bump electrode 40 and the individual connection terminal 54. Then, the first region a1" is a region on the inner side (the opposite side of the bump electrode 40) than the imaginary line L", and the second region a2" is a region on the outer side (the bump electrode 40 side) than the imaginary line L". Since other configurations are the same as the above-mentioned first embodiment, a description thereof will be omitted.

Further, in the above-mentioned respective embodiments, the first wiring 61 and the second wiring 62 are adjacent to each other, but is not limited thereto. For example, a plurality of first wiring groups which are adjacent to each other in the nozzle array direction and a plurality of second wiring groups which are adjacent to each other in the nozzle array direction may be disposed alternately along the nozzle array direction. In short, at least a part of wiring groups connecting the individual connection terminal and the bump electrode are formed into first wirings, and the remainder may be formed into second wirings.

Further, in the above-mentioned respective embodiments, the individual connection terminal 54 and the bump electrode 40 are disposed at an equal interval along the nozzle array direction (first direction), but are not limited thereto. The present invention can also be applied to the individual connection terminal and the bump electrode which are not disposed at an equal interval along the nozzle array direction. In short, the individual connection terminal and the bump electrode may be spaced at an interval. Further, in the above-mentioned respective embodiments, the bump electrode 40 is provided on the sealing plate 33 side, but is not limited thereto. For example, the bump electrode can be provided on the pressure chamber substrate side. In this case, the terminal on the sealing plate side opposite to the bump electrode becomes the second terminal in the present invention. Further, in the above-mentioned respective embodiments, the bump electrode 40 is configured with the internal resin 40*a* and the conductive film 40*b*, but is not limited thereto. For example, the bump electrode can be made of metal such as gold (Au) or solder. Further, in the above-mentioned respective embodiments, the pitch P1 of the individual connection terminal 54 is formed smaller than the pitch P2 of the bump electrode 40, but is not limited thereto. For example, the pitch of the individual connection terminal can be formed greater than the pitch of the bump electrode. Further, in the above-mentioned manufacturing method, the silicon single crystal substrate on the pressure chamber formation substrate 29 side is coated with the photosensitive adhesive 43, but is not limited thereto. For example, the silicon single crystal substrate on the sealing plate side is coated with the photosensitive adhesive.

Further, in the above description, an ink jet recording head mounted on an ink jet printer is exemplified as a liquid ejecting head, but can also be applied to those that eject liquid other than ink. For example, it is possible to apply the present invention to a color material ejecting head used for manufacturing color filters such as a liquid crystal display; an electrode material ejecting head used for electrode formation for an organic electro luminescence (EL) display, a surface emission display (FED), and the like; a bio-organic material ejecting head used for manufacturing biochips (biochemical elements).

Furthermore, the utilization of the present invention is not limited to an actuator for a liquid ejecting head, and for example, the present invention can also be applied to electronic devices or the like used for various sensors and the like.

The present application claims priority to Japanese Patent Application No. 2015-051589 filed on Mar. 16, 2015, which is hereby incorporated by reference in its entirety.

What is claimed is:
1. An electronic device comprising:
a wiring substrate including a first surface and a second surface, a drive element formation substrate provided with a plurality of drive elements being connected to the first surface, a drive IC that drives the drive elements being provided on a second surface that is on an opposite side of the first surface,
wherein the wiring substrate includes a first region and a second region on the second surface, a plurality of first terminals which receive a signal from the drive IC being arranged in a first direction in the first region, and the second region being in a position different from the first region,
wherein a plurality of second terminals that output the signal to the drive elements are arranged at a pitch different from a pitch of the first terminal in the first direction, in a region overlapping the second region in a plan view, on the first surface of the wiring substrate, and
wherein a wiring group connecting the first terminals and the second terminals includes a first wiring of which a position of a relay wiring portion relaying the first surface and the second surface is within the first region, and a second wiring of which a position of a relay wiring portion connecting the first surface and the second surface is within the second region.
2. The electronic device according to claim 1,
wherein the first wiring and the second wiring are arranged so as to be adjacent to each other in the first direction.

3. The electronic device according to claim 1,
wherein the second terminals each includes a resin layer provided on the first surface and a conductive layer of which at least a portion is provided in the resin layer, and
wherein a portion of the wiring group that is provided on the first surface is formed of the conductive layer.

4. The electronic device according to claim 1,
wherein a relay wiring portion of the second wiring is formed at a position spaced apart from the first terminal than the second terminal.

5. The electronic device according to claim 1,
wherein a relay wiring portion of the first region and a relay wiring portion of the second region are pass-through wirings made of conductors which are formed inside pass-through holes passing through the wiring substrate in the thickness direction.

\* \* \* \* \*